United States Patent [19]
Shah

[11] Patent Number: 5,559,465
[45] Date of Patent: Sep. 24, 1996

[54] OUTPUT PRECONDITIONING CIRCUIT WITH AN OUTPUT LEVEL LATCH AND A CLAMP

[75] Inventor: Shailesh Shah, San Jose, Calif.

[73] Assignee: Cypress Semiconductor Corporation, San Jose, Calif.

[21] Appl. No.: 283,223

[22] Filed: Jul. 29, 1994

[51] Int. Cl.[6] .................................................. H03K 17/04
[52] U.S. Cl. ............................. 327/374; 326/17; 326/56
[58] Field of Search .................................. 326/21, 26, 27, 326/17, 56, 20, 58; 327/379, 108, 109, 110, 111, 112, 374, 76, 367, 80, 377

[56] References Cited

U.S. PATENT DOCUMENTS

| | | | |
|---|---|---|---|
| 4,983,860 | 1/1991 | Yim et al. | 307/443 |
| 4,988,888 | 1/1991 | Hirose et al. | 326/27 |
| 4,992,677 | 2/1991 | Ishibashi et al. | 326/27 |
| 5,057,711 | 10/1991 | Lee et al. | 326/27 |
| 5,124,577 | 6/1992 | Davis et al. | 327/374 |
| 5,151,621 | 9/1992 | Goto | 307/475 |
| 5,237,213 | 8/1993 | Tanoi | 327/379 |
| 5,311,076 | 5/1994 | Park et al. | 326/21 |
| 5,336,947 | 8/1994 | Lehning | 327/76 |
| 5,418,472 | 5/1995 | Moench | 327/76 |

OTHER PUBLICATIONS

F. Miyaji, K. Seno, H. Satoh, Y. Tomo, M. Sasaki and K. Kobayashi, "A 14ns 0.35 um 4Mb CMOS SRAM with an Output Preconditioning Circuit," ULSI R&D Group, Atsugi Technology Center, Sony Corp.

L. Childs, K. Jones, R. Chang, M. Bader, R. Yu and K. Wang, "A 16ns 512Kx8 CMOS SRAM with Power Saving and Output Buffer Noise Reduction Features," Memory Product Division, Motorola Inc.

Primary Examiner—Timothy P. Callahan
Assistant Examiner—Jeffrey Zweizig
Attorney, Agent, or Firm—Blakely, Sokoloff, Taylor & Zafman

[57] ABSTRACT

An output preconditioning circuit with an output level latch is provided to precondition the output to an intermediate level and to clamp the output to that level before the actual data from a memory cell arrives at the output. Since the actual data has to charge or discharge the output from some intermediate level rather than the maximum output swing level or the minimum output swing level, as in the normal case, this results in a reduced delay in charging or discharging the output. The output preconditioning circuit which may be coupled to a heavy load or a light load can eliminate oscillation of the output because of the output level latch. The preconditioning system includes (1) a level sense circuit for sensing a voltage level of the circuit output and comparing the voltage level to two different reference voltages and (2) a preconditioning circuit including a latch circuit for latching the values in response to the comparison and a driver-and-clamp circuit for clamping the circuit output to an intermediate voltage level when the values indicate that the circuit output is out of the desired range.

15 Claims, 5 Drawing Sheets

OUTPUT PRECONDITIONING CIRCUIT WITH AN OUTPUT LEVEL LATCH AND A CLAMP

BACKGROUND OF THE INVENTION

1. Field the Invention

The present invention relates to the field of computer memory and input/output circuits, and more particularly, to output preconditioning circuits or output precharge circuits.

2. Description of the Related Art

Synchronous SRAMs are often specified with a large capacitive load (50 pf–85 pF). Since charge is equal to capacitance times voltage (Q=C*V), a large capacitance (C) means that the output driver has to charge or discharge a large amount of charge. One way to reduce the amount of charge to be charged or discharged is to reduce the voltage swing V (i.e., V=VOH–VOL, in the normal case) for a given capacitive load where VOH is the maximum output swing level, and VOL is the minimum output swing level. In the past, attempts have been made to reduce this voltage swing V by preconditioning the output to certain intermediate level Vint such that VOH–$V_{int}$ is less than VOH–VOL, or $V_{int}$–VOL is less than VOH–VOL. A smaller amount of charge results in a faster output delay for a given output driver and output load, and also reduces noise. Normally preconditioning is accomplished by sensing the voltage level of the output and by determining the direction of preconditioning. Then the preconditioning drivers drive the output to an intermediate level.

However, the problem with the prior art circuits is the response of preconditioning circuit to a very low Capacitive load. In this case, the output can start oscillating before the actual data arrives at the output. For example, if the output is low (i.e., the output is at the VOL level), the preconditioning circuit starts preconditioning the output towards the VOH level. Since the capacitive load is low, the output driver preconditions the output to VOH level very fast. Since the actual data has not arrived yet, the preconditioning circuit senses the output at the VOH level and starts driving the output from the VOH level to the VOL level. Thus, the output will oscillate until the actual data arrives. The preconditioning circuit is then shut off. Also, if the output is preconditioned up to the full TTL level (i.e., VOH or VOL), the advantage of preconditioning vanishes as the amount of charge to charge or discharge is not reduced.

The implementation of output preconditioning has been described in two papers. A paper titled "A 14 ns 0.35 μm 4M6 CMOS SRAM with an Output Preconditioning Circuit" by Fumio Miyaji of ULSI R & D Group of SONY Corporation describes a preconditioning circuit without an output level latch circuit. This preconditioning circuit is mainly used for 3 V output power supply and uses a pseudo clamping scheme. The circuit uses a p-channel diode for VOL clamping and an n-channel diode for VOH clamping. For 3 V output power supplies, an n-channel VOH clamp should be sufficient, but for 5 V power supplies, the n-channel clamp will result in preconditioning of the output to almost VOH level, and thereby the scheme does not provide the benefit of preconditioning the output for 5 V power supplies.

In a paper titled "A 16 ns 512K×8 CMOS SRAN With Power Saving and Output Buffer Noise Reduction Features" by Larry Childs of Memory Product Division of Motorola Inc., an output preconditioning circuit is proposed to control noise. This paper, however, does not suggest the use of either output level clamping or output level latching described and claimed in the present invention.

The present invention solves the various problems mentioned above through innovative circuit design techniques.

SUMMARY OF THE INVENTION

The present invention provides an output preconditioning circuit with an output level latch to precondition the output to an intermediate level and to clamp the output to that level before the actual data from a memory cell arrives at the output. Since the actual data has to charge or discharge the output from some intermediate level rather than the maximum output swing level or the minimum output swing level, as in the normal case, this results in a minimum delay in charging or discharging the output.

More specifically, the present invention provides a method for preconditioning a circuit output coupled to either of a heavy capacitive load or a light capacitive load and for eliminating oscillation of the circuit output when the circuit output is coupled to the light capacitive load. The method includes the steps of sensing a voltage level of the circuit output, comparing the voltage level to two different reference voltages, latching the values in response to the comparison, and clamping the circuit output to an intermediate voltage level when the values indicate that the circuit output is out of the desired range, and releasing the circuit output when the actual data arrives.

In addition, the present invention provides a circuit for preconditioning a circuit output coupled to either of a heavy capacitive load or a light capacitive load and for eliminating oscillation of the circuit output when the circuit output is coupled to the light capacitive load. The circuit includes (1) a level sense circuit for sensing a voltage level of the circuit output and comparing the voltage level to two different reference voltages and (2) a preconditioning circuit including (a) a latch circuit for latching the values in response to the comparison and (b) a driver-and-clamp circuit for clamping the circuit output to an intermediate voltage level when the values indicate that the circuit output is out of the desired range and for releasing the circuit output when the actual data arrives.

DETAILED DESCRIPTION OF THE INVENTION

Figure 1:
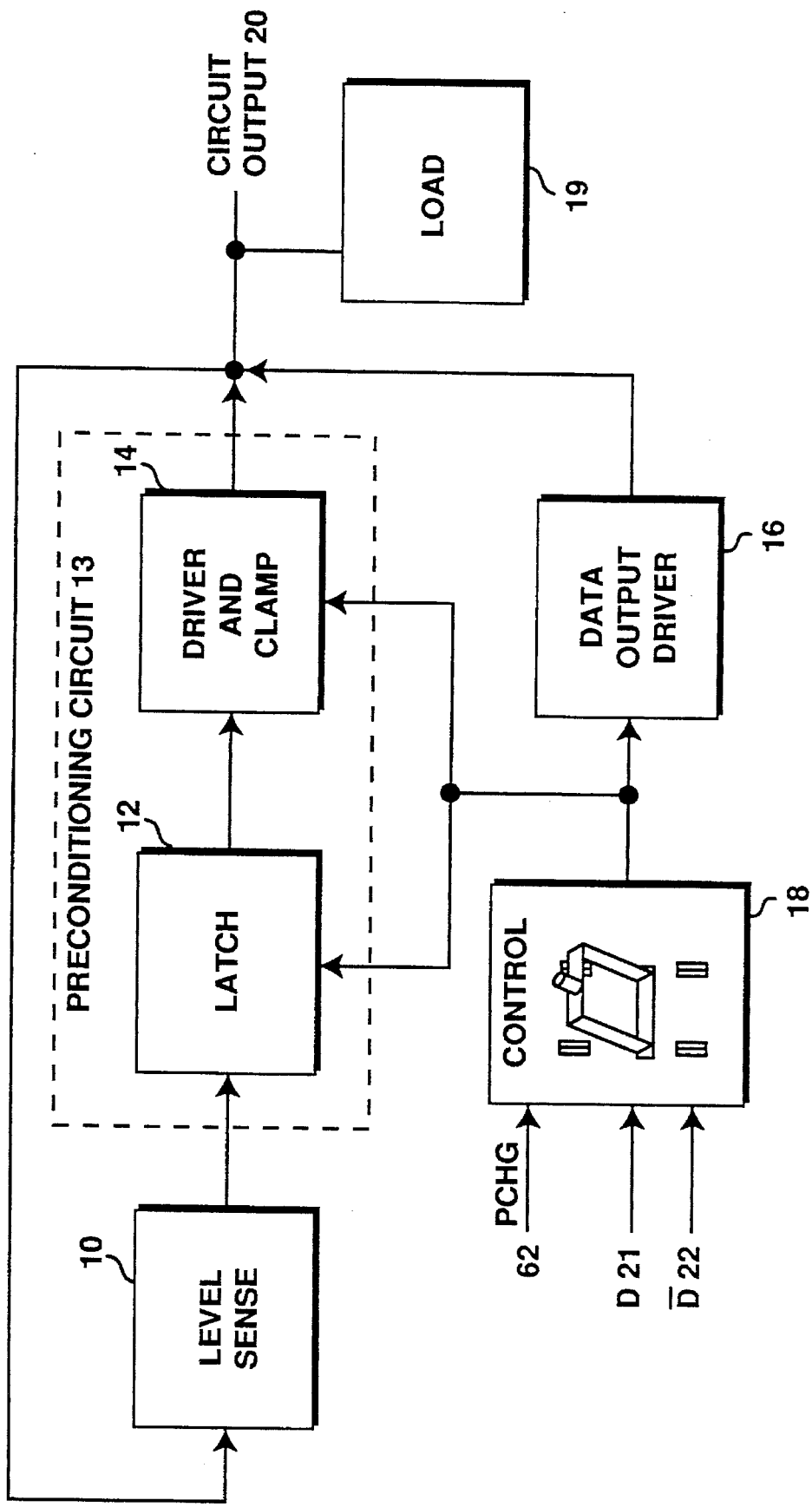
FIG. 1 is a block diagram of an output preconditioning system according to the present invention.

FIG. 1 shows a block diagram of an output preconditioning system according to the present invention. The output preconditioning system includes a level sense circuit 10, a preconditioning circuit 13, a control circuit 18 and a data output driver 16. Level sense circuit 10 is coupled to a circuit output 20 so that level sense circuit 10 can sense (a) the high voltage level at circuit output 20 if circuit output is above a second reference voltage or (b) the low voltage level if circuit output 20 is below a first reference voltage.

Preconditioning circuit 13 has a latch circuit 12 and a driver-and-clamp circuit 14. Latch circuit 12 latches the value from level sense circuit 10. Driver-and-clamp circuit 14 takes the value from latch circuit 12 and pulls up or pulls down circuit output 20 to an intermediate voltage level when circuit output 20 is either below a first reference voltage or above a second reference voltage, respectively. Both latch circuit 12 and driver-and-clamp circuit 14 are controlled by control circuit 18. Driver-and-clamp circuit either acts as an active pull-up or pull-down clamp as appropriate. Driver-and-clamp circuit 14 is disabled when the actual data arrives from data output driver 16. Control circuit 18 determines when latch circuit 12 should latch, when driver-and-clamp circuit 14 should be enabled or disabled and when data output driver 16 should be enabled or disabled.

Figure 2:
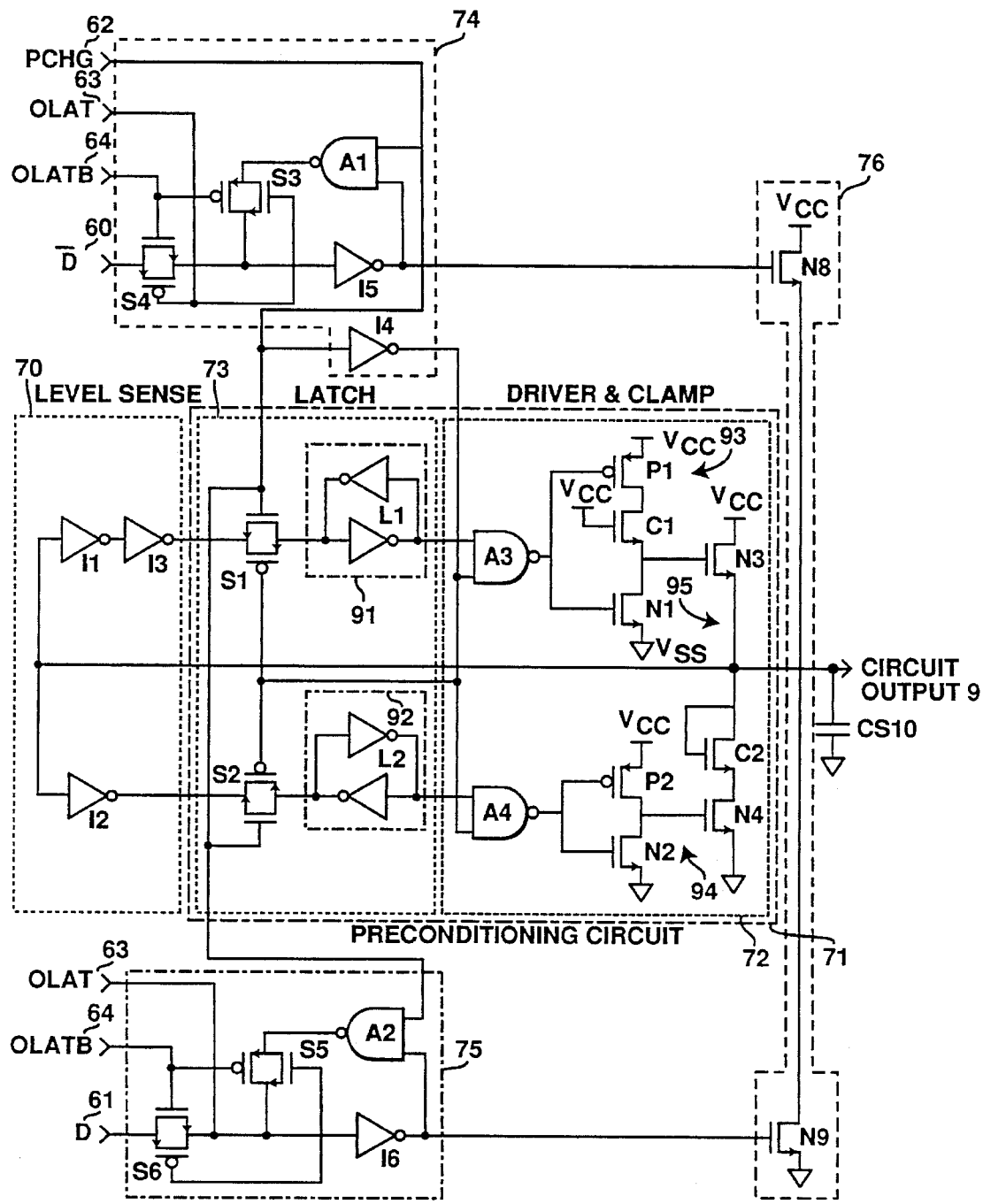
FIG. 2 is an output preconditioning system according to the preferred embodiment of the present invention including a level sense circuit, a latch circuit, a driver-and-clamp circuit.

FIG. 2 is an output preconditioning system according to the preferred embodiment of the present invention. The output preconditioning system shows the various components of the circuits in detail. The output preconditioning system includes a level sense circuit 70, a preconditioning circuit 71 including a latch circuit 73 and a driver-and-clamp circuit 72, control circuits 74 and 75, and a data output driver circuit 76. A load CS10 may be a heavy capacitive load or a light capacitive load. In the prior art, when CS10 is a light capacitive load, circuit output 98 can oscillate before the actual data arrives at circuit output 98. However, the present invention prevents such oscillation of circuit output 98, by incorporating latch circuit 73.

In FIG. 2, level sense circuit 70 includes a first inverter I1, a second inverter I2 and a third inverter I3. Inverter I1 has a low trip point and is used to enable the pull-up path of the preconditioning system. Inverter I2 has a high trip point and is used to enable the pull-down path of the preconditioning system. When circuit output 98 is below the low trip point, the output of I1 is high and the output of I3 is low while the output of I2 is high. When circuit output 98 is above the high trip point, the output of I2 is low, while the output of I1 is low and the output of I3 is high. If circuit output 98 is between the high trip point of I2 and the low trip point I1, the output of I2 is high, the output of I3 is high, and preconditioning circuit 71 is inactive so that circuit output 98 remains at its level. It will be appreciated that inverter I1 acts as a comparator in that it compares its input signal to its low trip point, where this trip point acts as a reference voltage (in effect); the input signal to inverter I1 is the circuit output 98 which is, in effect, compared to the reference voltage which is the trip point of inverter I1. Similarly, inverter I2 acts as a comparator in that it compares its input signal to its high trip point, where the high trip point acts as another reference voltage; the input signal to inverter I2 is the circuit output 98 which is compared to another reference voltage which is the trip point of inverter I2. It will be appreciated that a voltage level comparator circuit may replace the two inverters which have different trip points.

When a PCHG 62 signal goes low, analog switches S1 and S2 are off, and values of the output of I3 and the output of I2 are latched by a latch device L1 and a latch device L2, respectively. During this time, an OLAT signal 63 is high, and an OLATB signal 64 is low. Since analog switches S1 and S2 are turned off, latch devices L1 and L2 are isolated from circuit output 98. Because latch devices L1 and L2 can be decoupled from circuit output 98, latch circuit 73 can prevent circuit output 98 from oscillation.

Driver-and-clamp circuit 72 includes a first NAND gate A3, an inverter 93, a second NAND gate A4, an inverter 94, and a driver 95. NAND gate A3 has two inputs. One of the inputs is coupled to the output of L1, and the other input is coupled to PCHG signal 62 of control circuit 74 through an inverter I4. Inverter 93 includes a p-channel transistor P1, an n-channel transistor C1 and an n-channel transistor N1. Each of the transistors has a drain, a source and a gate. The gates of P1 and N1 are coupled to the output of A3, the gate of C1 is coupled to $V_{cc}$. The source of P1 is coupled to $V_{cc}$. The source of N1 is coupled to ground. P1, C1 and N1 are connected in series. The drain of N1 and the source of C1 are the output of inverter 93.

NAND gate A4 also has two inputs where the first input is coupled to the output of latch device L2, and the second input is coupled to PCHG signal 62 through inverter I4.

Inverter 94 includes a p-channel transistor P2 and an n-channel transistor N2 where the gates of P2 and N2 are coupled to the output of NAND gate A4, and the drains of P2 and N2 are coupled to each other and become the output of inverter 94.

Driver 95 includes an n-channel transistor N3 coupled to circuit output 98, an n-channel transistor C2 coupled to circuit output 98 and an n-channel transistor N4. The gate of N4 is coupled to the output of inverter 94, the source of N4 is coupled to ground. Transistors N3, C2 and N4 are connected in series, and the drain of N3 is coupled to $V_{cc}$ while the gate of N3 is coupled to the output of inverter 93, and the gate of C2 is coupled to the drain of C2.

Components A3, 93 and N3 are used to pull up circuit output 98 while components A4, 94, C2 and N4 are used to pull down circuit output 98. First, the pull-up process is described. When circuit output 98 is below the trip point of I1, I3 outputs a low signal, latch device L1 outputs a high signal. When PCHG signal 62 outputs a low signal and the L1 output is high, NAND gate A3 produces a low signal. While C1 is already on (the gate of this n-channel MOSFET is coupled to Vcc), the low signal of A3 turns on P1, thereby turning on transistor N3. The high output of inverter 93 is clamped to $V_{cc}$ subtracted by threshold voltage of C1. Circuit output 98 is clamped to an intermediate voltage level which is less than or equal to $V_{cc}$ subtracted by the threshold voltage of C1 and by the threshold voltage of N3 or $V_{cc}-2\,V_{tn}$. Whether circuit output 98 reaches $V_{cc}-2\,V_{tn}$ is determined by how long driver-and-clamp circuit 72 stays active and is determined by output load. PCHG signal 62 enables driver-and-clamp circuit 72. If PCHG signal 62 stays low for a relatively long period of time, or output capacitive load is relatively small, then circuit output 98 will reach $V_{cc}-2\,V_{tn}$. When PCHG signal 62 becomes high, NAND gate A3 turns off transistor N3, and NAND gate A4 turns off transistor N4, thereby disabling driver-and-clamp circuit 72 from circuit output 98.

When circuit output 98 is below the trip point of I1, the output of I2 is high. When PCHG signal 62 (by being low) turns off switch S2, L2 latches a high signal from the output of I2 and outputs a low signal to A4. When PCHG signal 62 becomes low, because L2 outputs a low signal, A4 outputs a high signal, turning on transistor N2 and turning off transistor N4. Thus, the pull-down path is disconnected from circuit output 98.

Second, the pull-down process is described. When circuit output 98 is above the trip point of I1, I3 outputs a high signal. When PCHG signal 62 disables analog switch S1, L1 latches a high signal and outputs a low signal, and NAND gate A3 of outputs a high signal. Transistor N1 turns on because the output of A3 is high. The output of inverter 93 becomes low, and transistor N3 is off. Thus, the pull-up path of the driver-and-clamp circuit is disabled.

At the same time, when circuit output 98 is above the high trip point of I2, I2 outputs a low signal. When PCHG signal 62 is low, analog switch S2 disconnects the output of I2 from latch device L2, latch device L2 latches the output of I2, and the output of L2 is high. When PCHG signal 62 becomes low, NAND gate A4 outputs a low because the output of L2 is high. When the output of A4 is low, transistor P2 turns on, and the output of 94 turns on transistor N4. Circuit output 98 thereby is clamped to an intermediate voltage level which is equal to or greater than the threshold voltage of C2 above ground.

Thus, when circuit output 98 is below the trip point of I1, the pull-up path comprising I1, I3, S1, L1, A3, 93 and N3 pulls up circuit output 98 to an intermediate voltage level. When circuit output 98 is above the trip point of I2, the pull-down path comprising I2, S2, L2, A4, 94, C2 and N4 pulls down circuit output 98 to another intermediate voltage level. However if circuit output 98 is greater than the trip point of I1 and less than the trip point of I2, preconditioning circuit 72 is disabled and circuit output 98 maintains its voltage level. It will be appreciated that in a typical embodiment where Vcc and Vss are the voltage rails, that: Vcc>(high trip point of I$_2$)>(the intermediate voltage levels)>(low trip point of I$_1$)>Vss.

While preconditioning circuit 71 is active, OLAT 63 is high and OLATB 64 is low so that the data cannot be sent to circuit output 98.

Data driver circuit 76 includes an n-channel transistor N8 and another n-channel transistor N9. Transistor N8 has a drain, a gate and a source. The drain of N8 is coupled to V$_{cc}$, the gate of N8 is coupled to I5 of control circuit 74, and the source of N8 is coupled to circuit output 98. The drain of N9 is coupled to circuit output 98 and to source of N8, the gate of N9 is coupled to inverter I6 of control circuit 75, and the source of N9 is coupled to ground.

When preconditioning circuit 71 is active, OLAT 63 is high and OLATB 64 is low so that data signals D 61 and D/60 are disconnected from data output driver circuit 76. It should be noted that D/or $\overline{D}$ is an inverted signal of D. To send data to circuit output 98, OLAT 63 must be low, and OLATB must be high. When OLAT 63 is low and OLATB 64 is high, analog switch S4 turns on, and signal D/60 can be transmitted to gate on N8. When D/60 is high, the gate of N8 is low, and thus, transistor N8 is off. When D/60 is low, the output of I5 is high, turning on N8 and pulling up circuit output 98 to V$_{cc}$−V$_{tn}$ where V$_{tn}$ is the threshold voltage of N8. In addition, when OLAT 63 is low and OLATB 64 is high, analog switch S6 is on. When D 61 is high, the output of I6 is low, turning off transistor N9. When D 61 is low, the gate of N9 is high, turning on transistor N9 and pulling down circuit output 98 to ground.

Control circuits 74 and 75 control latch circuit 73 by turning on or turning off analog switches S1 and S2 and control driver-and-clamp circuit 72 by supplying either a high signal or a low signal to the second input of each of NAND gates A3 and A4. Control signals OLAT 63 and OLATB 64 control whether data values D 61 and D/60 are to be sent to data driver circuit 76.

Figure 3A:
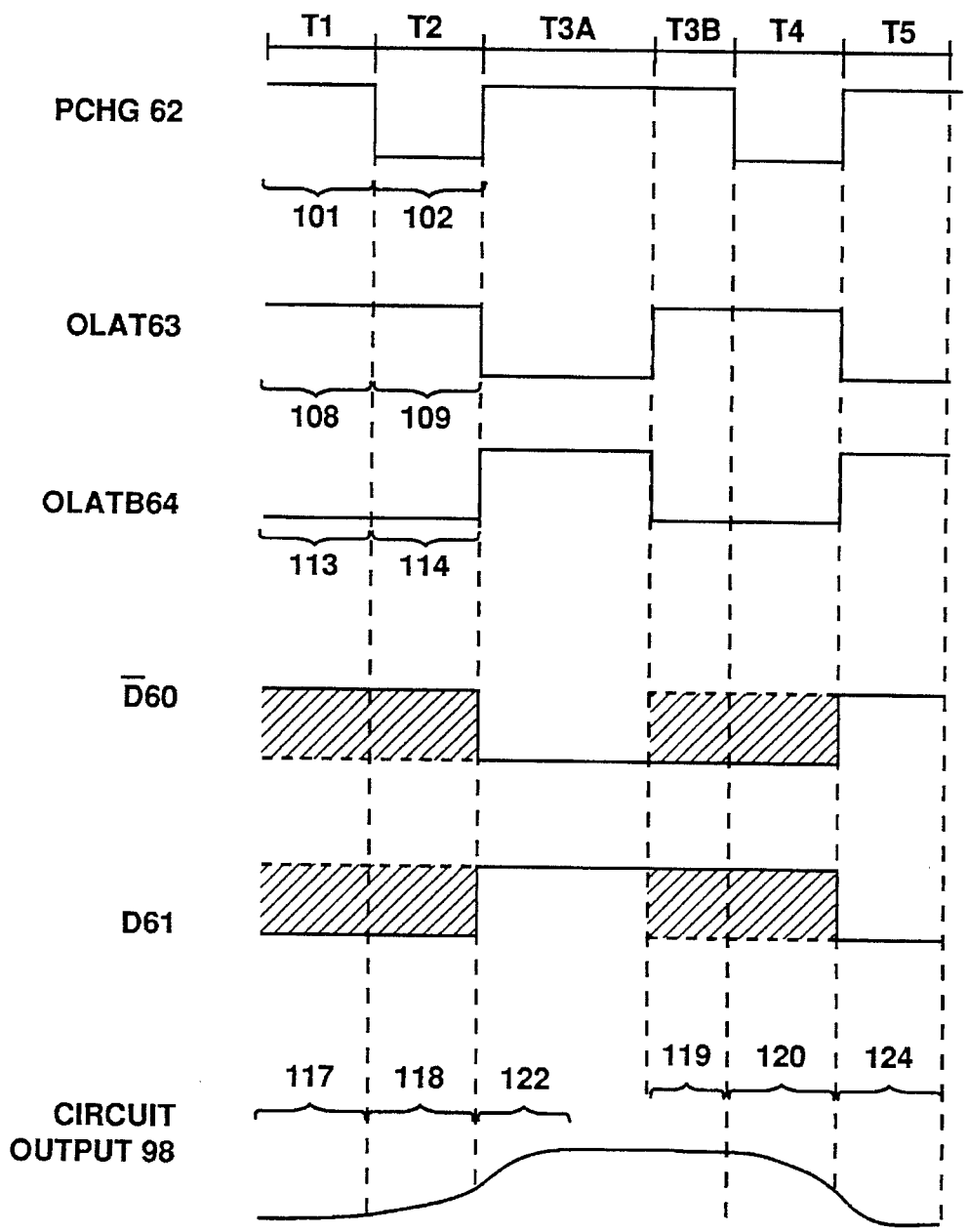
FIG. 3A is a timing diagram of the output preconditioning system of FIG. 2.

FIG. 3A shows a typical timing diagram of Control signals PCHG 62, OLAT 63 and OLATB 64, data signal D 61, and an output signal at circuit output 98. During the time period of T1, level sense circuit 70 senses the voltage level of circuit output 98. Circuit output 98 is initially at a logic 0 which is lower than the low trip point of I1. In this example, the output of I3 is low, and the output of I2 is high. During the time period of T1, PCHG 62 is high, as shown as a region 101, OLAT 63 is high (a region 108), OLATB 64 is low (a region 113), and circuit output 98 is low (a region 117). During T1, analog switches S1 and S2 are turned on, and the output values of I3 and I2 are transmitted to latch devices L1 and L2.

During the period of T2, PCHG 62 goes low (a region 102), the output values of I3 and I2 are latched by L1 and L2, OLAT 63 stays high (a region 109), OLATB 64 stays low (a region 114), circuit output 98 is pulled up to an intermediate level (a region 118). During T2, because PCHG 62 is low as shown as region 102, driver-and-clamp circuit 72 becomes active. In this case, because L1 outputs 1 and L2 outputs 0, the pull-up path is active while the pull-down path is inactive. Thus, driver-and-clamp circuit 72 pulls up circuit output 98 as shown in region 118.

During the period of T3A, PCHG 62 becomes high, OLAT 63 becomes low, OLATB 64 becomes high, sending data D/60 and D 61 to data driver circuit 76, thereby charging circuit output 98 according to the data. Data D/60 and D 61 are transmitted to data driver circuit 76 only when PCGH 62 is high, OLAT 63 is low and OLATB 64 is high, as in period T3A. As a result, the values of D/60 and D 61 during periods T1, T2, T3B and T4 do not affect circuit output 98.

During the period including T3B, T4 and T5, the process of sensing the voltage of circuit output 98, latching the output value of level sense circuit 70, driving and clamping circuit output 98 repeats. During the time period of T4 and T5, because circuit output 98 is high (a region 119), the driver-and-clamp circuit pulls down circuit output 98 to an intermediate voltage as shown as a region 120, and eventually transistor N9 of data driver circuit 76 pulls down circuit output 98 to a logic 0 (a region 121).

Figure 3B:
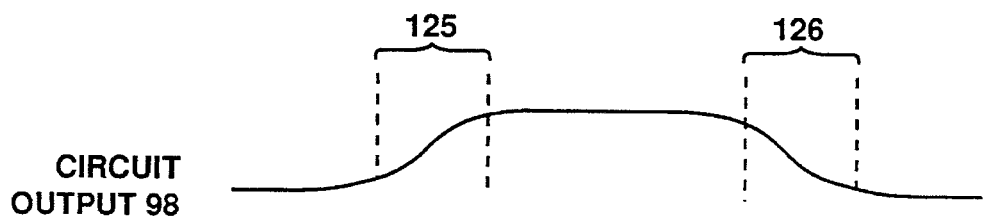
FIG. 3B presents a waveform at the output node.

FIG. 3B presents a waveform at circuit output 98. Although, in FIG. 3A, the waveform of circuit output 98 shows a step between a logic 0 and logic 1, in reality, when the time period T2 is very short, the waveform will look more like the one shown in FIG. 3B where the distinction between having a preconditioning circuit and not having a preconditioning circuit is not distinctive from the waveform. Region 125 of FIG. 3B corresponds to regions 118 and 122 in FIG. 3A.

Figure 4B:
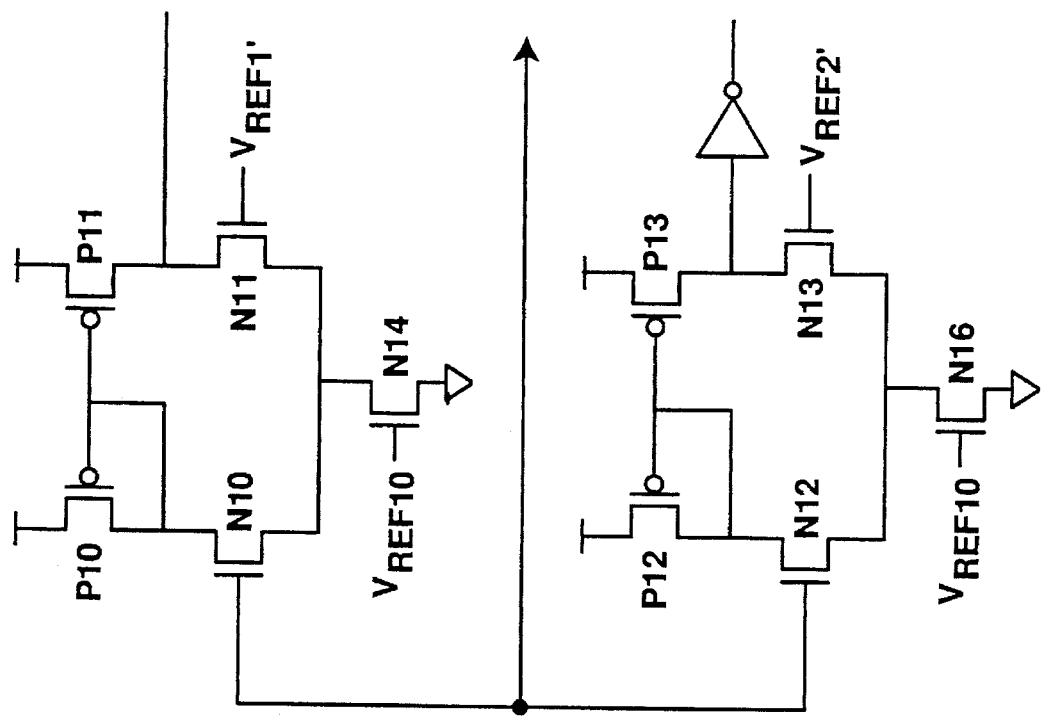
FIG. 4B presents a circuit corresponding to the level sense circuit of FIG. 4A.
Figure 4A:
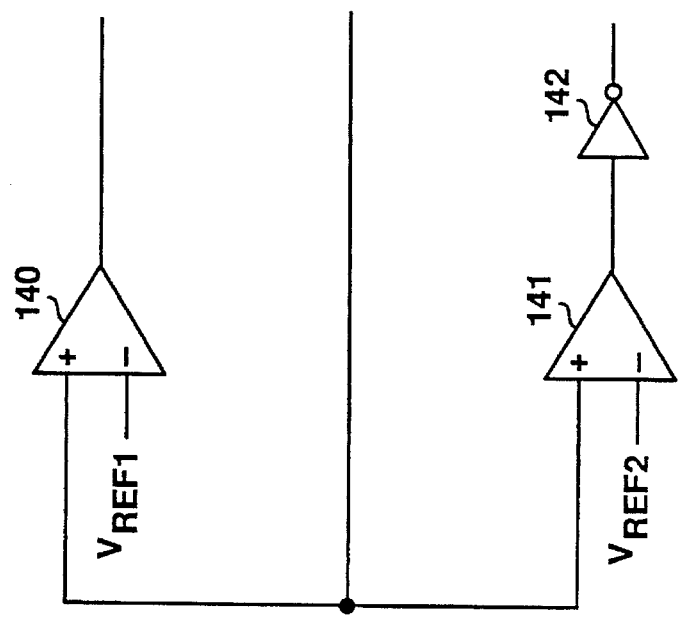
FIG. 4A presents another embodiment of a level sense circuit.

FIG. 4A presents another embodiment of a level sense circuit. This level sense circuit includes a comparator 140, a comparator 141 and an inverter 142. The level sense circuit in FIG. 4A uses two reference voltages V$_{REF1}$ and V$_{REF2}$. The positive inputs of 140 and 141 are coupled to a circuit output node, while the output of comparator 140 is coupled to analog switch S1, and the output of inverter 142 is coupled to analog switch S2 of latch circuit 73 in FIG. 2. V$_{REF1}$ is less than V$_{REF2}$ so that when a circuit output is lower than V$_{REF1}$, comparator 140 outputs a low signal, and inverter 142 outputs a high signal. When the circuit output is greater than V$_{REF2}$, comparator 140 outputs a high signal, and the inverter 142 outputs a low signal. FIG. 4B shows an example of comparators 140 and 141 in FIG. 4A.

Figures 5, 6, 7:
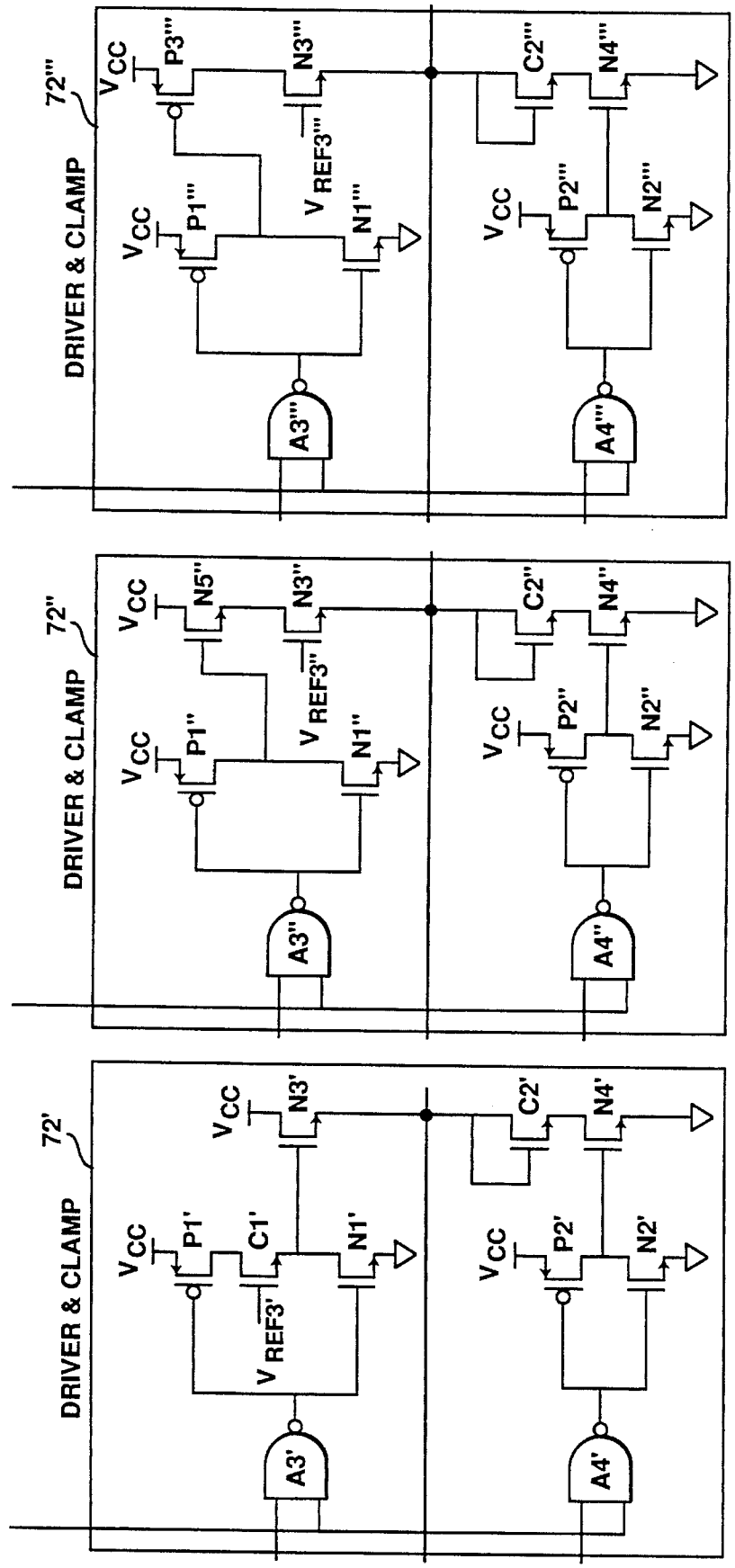
FIG. 5 presents a second embodiment of a driver-and-clamp circuit according to the present invention.
FIG. 6 presents a third embodiment of a driver-and-clamp circuit according to the present invention.
FIG. 7 shows another embodiment of a driver and clamp circuit according to the present invention.

FIG. 5 presents a second embodiment of a driver-and-clamp circuit according to the present invention. Driver-and-clamp circuit 72' shown in FIG. 5 is identical to driver-and-clamp circuit 72 of FIG. 2 except that the gate of C1' is connected to $V_{REF3}$ instead of Vcc so that when the circuit output is pulled up to an intermediate voltage level, that intermediate level voltage can be either less than or equal to $V_{REF3}$ subtracted by the threshold voltage of C1' and the threshold voltage of N3' or $V_{REF3}-2V_{tn}$.

In FIG. 6, a third embodiment of a driver-and-clamp circuit is shown according to the present invention. In this example, the pull-down path circuitry comprising A4", P2", N2", C2" and N4" are the same as the pull-down path circuitry of driver-and-clamp circuit in FIG. 2. However, the pull-up path circuitry has an inverter including a p-channel transistor P1" and an n-channel transistor N1", an n-channel transistor N5" and an n-channel transistor N3". In this example, the gates of P1" and N1" are connected to the output of A3". Each of transistors N5" and N3" has a drain, a gate and a source. The drain of N5" is coupled to Vcc, the gate of N5" is connected to the drains of P1" and N1". The source of N5" is connected to the drain of N3" while the gate of N3" is connected to $V_{REF3}$". The source of N3" is connected to the drain of C2" and to a circuit output node. When the circuit output is pulled up to an intermediate level, the intermediate level can be less than or equal to $V_{REF3}$" subtracted by the threshold voltage of N3" or $V_{REF3}"-V_{tn}$.

FIG. 7 presents a fourth embodiment of a driver-and-clamp circuit according to the present invention. Driver-and-clamp circuit 72''' is identical to drive-and-clamp circuit 72" of FIG. 6 except that N5" of FIG. 6 is replaced by a p-channel transistor P3''' and that NAND gate A3" FIG. 6 is replaced by an AND gate A3.

While the present invention has been particularly described with reference to FIGS. 1 through 7, it should be understood that the figures are for illustration only and should not be taken as limiting the scope of the invention. Many changes and modifications may be made to the invention, by one having ordinary skill in the art, without departing from the spirit and scope of the invention as disclosed herein.

What is claimed is:

1. A method for preconditioning a circuit output coupled to one of a heavy capacitive load or a light capacitive load, said method comprising the steps of:

sensing a voltage level of said circuit output;

comparing said voltage level to at least a first reference voltage;

latching at least a first value in response to said comparison;

clamping said circuit output to an intermediate voltage level when said first value indicates that said circuit output is out of a range;

comparing said voltage level to a second reference voltage before the step of latching said first value;

latching a second value in response to the step of comparing said voltage level to said second reference voltage before the step clamping said circuit output to said intermediate voltage level; wherein the step of latching said first value in response to said comparison is controlled by a control circuit;

wherein when said first value is latched, a first latch device for performing said step of latching said first value is inhibited from receiving a new value until said control circuit allows said latch device receive said new value;

wherein the step of clamping said circuit output to said intermediate voltage level is controlled by said control circuit;

wherein the step of comparing said voltage level to said first reference voltage includes (1) outputting a first high signal when said voltage level is below a first trip point and a first low signal when said voltage level is above said first trip point and (2) inverting one of said first high signal and said first low signal;

wherein the step of comparing said voltage level to said second reference voltage includes outputting a second high signal when said voltage level is below a second trip point and a second low signal when said voltage level is above said second trip point;

wherein said second trip point is higher than said first trip point;

wherein said first trip point is said first reference voltage, and said second trip point is said second reference voltage;

wherein the step of latching said first value includes the steps of (1) passing one of said first high signal and said first low signal through a first analog switch circuit and (2) latching one of said first high signal and said first low signal in said first latch device; and wherein the step of latching said second value includes the steps of (1) passing one of said second high signal and said second low signal through a second analog switch circuit and (2) latching one of said second high signal and said second low signal in a second latch device.

2. A method for preconditioning a circuit output coupled to one of a heavy capacitive load or a light capacitive load, said method comprising the steps of:

sensing a voltage level of said circuit output;

comparing said voltage level to at least a first reference voltage;

latching at least a first value in response to said comparison;

clamping said circuit output to an intermediate voltage level when said first value indicates that said circuit output is out of a range;

comparing said voltage level to a second reference voltage before the step of latching said first value;

latching a second value in response to the step of comparing said voltage level to said second reference voltage before the step of clamping said circuit output to said intermediate voltage level;

wherein the step of latching said first value in response to said comparison is controlled by a control circuit;

wherein when said first value is latched, a first latch device for performing said step of latching said first value is inhibited from receiving a new value until said control circuit allows said latch device to receive said new value;

wherein the step of clamping said circuit output to said intermediate voltage level is controlled by said control circuit;

wherein the step of clamping said circuit output to said intermediate voltage level includes pulling up said circuit output to said intermediate voltage level when said voltage level is below said first reference voltage and pulling down said circuit output to said intermediate voltage level when said voltage level is above said second reference voltage;

wherein when said circuit output is pulled up to said to intermediate voltage level, said intermediate voltage level is less than one of (1) a maximum circuit output voltage subtracted by a first threshold voltage amount and (2) a third reference voltage subtracted by said first threshold voltage amount and wherein when said circuit output is pulled down to said intermediate voltage level, said intermediate voltage level is greater than a second threshold voltage amount above a minimum circuit output voltage.

3. The method according to claim 2 wherein (1) said maximum circuit output voltage is a voltage of a power supply coupled to a driver-and-clamp circuit for clamping said circuit output to said intermediate voltage level subtracted by said second threshold voltage, (2) said minimum circuit output voltage is ground, and (3) said first threshold voltage is twice said second threshold voltage.

4. A circuit for preconditioning a circuit output coupled to one of a heavy capacitive load or a light capacitive load, said circuit comprising:

a level sense circuit said level sense circuit being coupled to said circuit output for sensing a voltage level of said circuit output and for comparing said voltage level to at least a first reference voltage;

a preconditioning circuit comprising:

a latch circuit said latch circuit being coupled to said level sense circuit for latching at least a first value in response to said comparison;

a driver-and-clamp circuit preconditioning and clamping said circuit output to an intermediate voltage level when said first value indicates that said circuit output is out of a range, said driver-and-clamp circuit being coupled to said latch circuit and said circuit output.

5. The circuit according to claim 4 wherein said level sense circuit compares said voltage level to a second reference voltage;

wherein said latch circuit includes a first latch device and a second latch device, and said first value is latched into said first latch device; and wherein a second value is latched into said second latch device in response to said comparison of said voltage level to said second reference voltage.

6. The circuit according to claim 5 further comprising a control circuit for controlling said latch circuit, said control circuit being coupled to said latch circuit, wherein when said latch circuit latches said first value into said first latch device and said second value into said second latch device, said latch circuit is inhibited from receiving a new value until said control circuit allows said latch circuit to receive said new value.

7. The circuit according to claim 6 wherein said control circuit controls said driver-and-clamp circuit, said control circuit being coupled to said driver-and-clamp circuit.

8. The circuit according to claim 7 wherein said level sense circuit comprises:

a first inverter having a first trip point, said first trip point being said first reference voltage, an input of said first inverter being coupled to said circuit output;

a second inverter having a second trip point, said second trip point being said second reference voltage, an input of said second inverter being coupled to said circuit output, an output of said second inverter being coupled to said latch circuit; and a third inverter, an input of said third inverter being coupled to an output of said first inverter, an output of said third inverter being coupled to said latch circuit wherein when said voltage level of said circuit output is below said first trip point, (1) said first inverter outputs a first high signal, (2) said second inverter outputs a second high signal, (3) said first high signal is inverted into a first low signal by said third inverter, (4) said first value is said first low signal, and (5) said second value is said second high signal;

wherein when said voltage level of said circuit output is above said second trip point, (1) said second inverter outputs a second low signal, (2) said first inverter outputs a third low signal, (3) said third low signal is inverted into a third high signal, (4) said second value is said second low signal, and (5) said first value is said third high signal; and wherein said first trip point is lower than said second trip point.

9. The circuit according to claim 7 wherein said level sense circuit comprises:

a first comparator having a positive input, a negative input and an output, said positive input of said first comparator being coupled to said circuit output, said negative input of said first comparator being coupled to said first reference voltage, said output of said first comparator being coupled to said latch circuit;

a second comparator having a positive input, a negative input and an output, said positive input of said second comparator being coupled to said circuit output, said negative input of said second comparator being coupled to said second reference voltage; and a first inverter, an input of said first inverter being coupled to said output of said second comparator, an output of said first inverter being coupled to said latch circuit wherein when said voltage level of said circuit output is below said first reference voltage, (1) said first comparator outputs a first low signal, (2) said second comparator outputs a second low signal, (3) said first inverter outputs a first high signal in response to said second low signal, (4) said first low signal is said first value, and (5) said first high signal is said second value; and wherein when said voltage level of said circuit output is above said second reference voltage, (1) said first comparator outputs a second high signal, (2) said second comparator outputs a third high signal, (3) said inverter outputs a second low signal in response to said third high signal, (4) said second high signal is said first value, and (5) said second low signal is said second value.

10. The circuit according to claim 7 wherein said latch circuit comprises:

a first analog switch, a first end of said first analog switch being coupled to said level sense circuit, said first analog switch being coupled to and controlled by said control circuit; and a second analog switch, a first end of said second analog switch being coupled to said level sense circuit, said second analog switch being coupled to and controlled by said control circuit;

wherein a first end of said first latch device is coupled to a second end of said first analog switch, and a second end of said first latch device is coupled to said driver-and-clamp circuit;

wherein a first end of said second latch device is coupled to a second end of said second analog switch, and a second end of said second latch device is coupled to said driver-and clamp circuit;

11 wherein when said control circuit turns on said first analog switch and said second analog switch, said first value is latched into said first latch device, and said second value is latched into said second latch device; and wherein after said first value and said second value are latched, the control circuit turns off said first analog switch and said second analog switch for a period of time so that said first latch device maintains said first value, and said second latch device maintains said second value.

11. The circuit according to claim 7 wherein said driver-and-clamp circuit comprises:

(1) a first NAND gate, a first input of said first NAND gate being coupled to said latch circuit, a second input of said first NAND gate being coupled to said control circuit;

(2) a first inverter comprising:
a first transistor having a drain, source and a gate, said source of said first transistor being coupled to a power supply, said gate of said first transistor being coupled to said output of said first NAND gate;
a second transistor having a drain, a source and a gate, said drain of said second transistor being coupled to said drain of said first transistor, said gate of said second transistor being coupled to said power supply; and
a third transistor having a drain, a source and a gate, said drain of said third transistor being coupled to said source of said second transistor, said gate of said third transistor being coupled to said output of said first NAND gate, said source of said third transistor being coupled to ground,
wherein said drain of said third transistor and said drain of said second transistor are an output of said first inverter;

(3) a second NAND gate, a first input of said second NAND gate being coupled to said latch circuit, a second input of said second NAND gate being coupled to said control circuit;

(4) a second inverter comprising:
a fourth transistor having a drain, a source and a gate, said source of said fourth transistor being coupled to said power supply, said gate of said fourth transistor being coupled to said output of said second NAND gate; and
a fifth transistor having a drain, a source and a gate, said drain of said fifth transistor being coupled to said drain of said fourth transistor, said gate of said fifth transistor being coupled to said output of said second NAND gate, said source of said fifth transistor being coupled to ground;
wherein said drain of said fifth transistor and said drain of said fourth transistor are an output of said second inverter; and (5) a third inverter comprising:
a sixth transistor having a drain, a source and a gate, said drain of said sixth transistor being coupled to said power supply, said gate of said sixth transistor being coupled to said output of said first inverter, said source of said sixth transistor being coupled to said circuit output;
a seventh transistor having a drain, a source and a gate, said drain of said seventh transistor being coupled to said gate of said seventh transistor and to said circuit output; and

12 an eighth transistor having a drain, a source and a gate, said drain of said eighth transistor being coupled to said source of said seventh transistor, said gate of said eighth transistor being coupled to said output of said second inverter, said source of said eighth transistor being coupled to said ground wherein when said voltage level of said circuit output is below said first reference voltage and when said second input of said first NAND gate is high, (a) said output of said first NAND gate is low, and (b) said sixth transistor pulls up said circuit output to said intermediate voltage level, said intermediate voltage level being not greater than a maximum circuit power supply voltage subtracted by a threshold voltage of said second transistor and a threshold voltage of said sixth transistor; and wherein when said voltage level of said circuit output is above said second reference voltage and when said second input of said second NAND gate is high, (a) said output of said second NAND gate is low, (b) said seventh transistor and said eighth transistor pull down said circuit output to said intermediate voltage level, said intermediate voltage level being not less than a threshold voltage of said seventh transistor above said ground.

12. The circuit according to claim 7 wherein said driver-and-clamp circuit comprises:

(1) a first NAND gate, a first input of said first NAND gate being coupled to said latch circuit, a second input of said first NAND gate being coupled to said control circuit;

(2) a first inverter comprising:
a first transistor having a drain, a source and a gate, said source of said first transistor being coupled to a power supply, said gate of said first transistor being coupled to said output of said first NAND gate;
a second transistor having a drain, a source and a gate, said drain of said second transistor being coupled to said drain of said first transistor, said gate of said second transistor being coupled to a third reference voltage; and
a third transistor having a drain, a source and a gate, said drain of said third transistor being coupled to said source of said second transistor, said gate of said third transistor being coupled to said output of said first NAND gate, said source of said third transistor being coupled to ground,
wherein said drain of said third transistor and said source of said second transistor are an output of said first inverter;

(3) a second NAND gate, a first input of said second NAND gate being coupled to said latch circuit, a second input of said second NAND gate being coupled to said control circuit;

(4) a second inverter comprising:
a fourth transistor having a drain, a source and a gate, said source of said fourth transistor being coupled to said power supply, said gate of said fourth transistor being coupled to said output of said second NAND gate; and
a fifth transistor having a drain, a source and a gate, said drain of said fifth transistor being coupled to said drain of said fourth transistor, said gate of said fifth transistor being coupled to said output of said second NAND gate, said source of said fifth transistor being coupled to said ground;
wherein said drain of said fifth transistor and said drain of said fourth transistor are an output of said second inverter; and (5) a third inverter comprising:
  a sixth transistor having a drain, a source and a gate, said drain of said sixth transistor being coupled to a power supply, said gate of said sixth transistor being coupled to said output of said first inverter, said source of said sixth transistor being coupled to said circuit output;
  a seventh transistor having a drain, a source and a gate, said drain of said seventh transistor being coupled to said gate of said seventh transistor and to said circuit output; and
  an eighth transistor having a drain, a source and a gate, said drain of said eighth transistor being coupled to said source of said seventh transistor, said gate of said eighth transistor being coupled to said output of said second inverter, said source of said eighth transistor being coupled to said ground
  wherein when said voltage level of said circuit output is below said first reference voltage and when said second input of said first NAND gate is high, (a) said output of said first NAND gate is low, and (b) said sixth transistor pulls up said circuit output to said intermediate voltage level, said intermediate voltage level being not greater than said third reference voltage subtracted by a threshold voltage of said second transistor and by a threshold voltage of said sixth transistor; and
  wherein when said voltage level of said circuit output is above said second reference voltage and when said second input of said second NAND gate is high, (a) said output of said second NAND gate is low, (b) said seventh transistor and said eighth transistor pull down said circuit output to said intermediate voltage level, said intermediate voltage level being not less than a threshold voltage of said seventh transistor above said ground.

13. The circuit according to claim 7 wherein said driver-and-clamp circuit comprises:
  (1) a first NAND gate, a first input of said first NAND gate being coupled to said latch circuit, a second input of said first NAND gate being coupled to said control circuit;
  (2) a first inverter comprising:
    a first transistor having a drain, a source and a gate, said source of said first transistor being coupled to a power supply, said gate of said first transistor being coupled to said output of said first NAND gate;
    a second transistor having a drain, a source and a gate, said drain of said second transistor being coupled to said drain of said first transistor, said gate of said second transistor being coupled to said output of said first NAND gate, said source of said second transistor being coupled to ground,
    wherein said drain of said second transistor and said drain of said first transistor are an output of said first inverter;
  (3) a second NAND gate, a first input of said second NAND gate being coupled to said latch circuit, a second input of said second NAND gate being coupled to said control circuit;
  (4) a second inverter comprising:
    a third transistor having a drain, a source and a gate, said source of said third transistor being coupled to said power supply, said gate of said third transistor being coupled to said output of said second NAND gate; and
    a fourth transistor having a drain, a source and a gate, said drain of said fourth transistor being coupled to said drain of said third transistor, said gate of said fourth transistor being coupled to said output of said second NAND gate, said source of said fourth transistor being coupled to said ground;
    wherein said drain of said fourth transistor and drain of said third transistor are an output of said second inverter; and (5) a third inverter comprising:
  a fifth transistor having a drain, a source and a gate, said drain of said fifth transistor being coupled to said power supply, said gate of said fifth transistor being coupled to said output of said first inverter;
  a sixth transistor having a drain, a source and a gate, said drain of said sixth transistor being coupled to said source of said fifth transistor, said gate of said sixth transistor being coupled to a third reference voltage, said source being coupled to said circuit output;
  a seventh transistor having a drain, a source and a gate, said drain of said seventh transistor being coupled to said gate of said seventh transistor and to said circuit output; and
  an eighth transistor having a drain, a source and a gate, said drain of said eighth transistor being coupled to said source of said seventh transistor, said gate of said eighth transistor being coupled to said output of said second inverter, said source of said eighth transistor being coupled to said ground
  wherein when said voltage level of said circuit output is below said first reference voltage and when said second input of said first NAND gate is high, (a) said output of said first NAND gate is low, and (b) said fifth transistor and said sixth transistor pull up said circuit output to said intermediate voltage level, said intermediate voltage level being not greater than said third reference voltage subtracted by a threshold voltage of said sixth transistor; and
  wherein when said voltage level of said circuit output is above said second reference voltage and when said second input of said second NAND gate is high, (a) said output of said second NAND gate is low, (b) said seventh transistor and said eighth transistor pull down said circuit output to said intermediate voltage level, said intermediate voltage level being not less than a threshold voltage of said seventh transistor above said ground.

14. The circuit according to claim 8 wherein said driver-and-clamp circuit comprises:
  (1) an AND gate, a first input of said AND gate being coupled to said latch circuit, a second input of said AND gate being coupled to said control circuit;
  (2) a first inverter comprising:
    a first transistor having a drain, a source and a gate, said source of said first transistor being coupled to a power supply, said gate of said first transistor being coupled to said output of said AND gate;
    a second transistor having a drain, a source and a gate, said drain of said second transistor being coupled to said drain of said first transistor, said gate of said second transistor being coupled to said output of said AND gate, said source of said second transistor being coupled to ground,
    wherein said drain of said second transistor and said drain of said first transistor are an output of said first inverter;
  (3) a NAND gate, a first input of said NAND gate being coupled to said latch circuit, a second input of said NAND gate being coupled to said control circuit;

(4) a second inverter comprising:
- a third transistor having a drain, a source and a gate, said source of said third transistor being coupled to said power supply, said gate of said third transistor being coupled to said output of said NAND gate; and
- a fourth transistor having a drain, a source and a gate, said drain of said fourth transistor being coupled to said drain of said third transistor, said gate of said fourth transistor being coupled to said output of said NAND gate, said source of said fourth transistor being coupled to said ground;
- wherein said drain of said fourth transistor and said drain of said third transistor are an output of said second inverter; and (5) a third inverter comprising:
- a fifth transistor having a drain, a source and a gate, said source of said fifth transistor being coupled to said power supply, said gate of said fifth transistor being coupled to said output of said first inverter;
- a sixth transistor having a drain, a source and a gate, said drain of said sixth transistor being coupled to said drain of said fifth transistor, said gate of said sixth transistor being coupled to a third reference voltage, said source being coupled to said circuit output;
- a seventh transistor having a drain, a source and a gate, said drain of said seventh transistor being coupled to said gate of said seventh transistor and to said circuit output; and
- an eighth transistor having a drain, a source and a gate, said drain of said eighth transistor being coupled to said source of said seventh transistor, said gate of said eighth transistor being coupled of said output of said second inverter, said source of said eighth transistor being coupled to said ground wherein when said voltage level of said circuit output is below said first reference voltage and when said second input of said AND gate is high, (a) said output of said AND gate is high, and (b) said fifth transistor and said sixth transistor pull up said circuit output to said intermediate voltage level, said intermediate voltage level being not greater than said third reference voltage subtracted by a threshold voltage of said sixth transistor; and wherein when said voltage level of said circuit output is above said second reference voltage and when said second input of said NAND gate is high, (a) said output of said NAND gate is low, (b) said seventh transistor and said eighth transistor pull down said circuit output to said intermediate voltage level, said intermediate voltage level being not less than a threshold voltage of said seventh transistor above said ground.

15. The circuit according to claim 8 further comprising a data output driver coupled to said control circuit and said circuit output, said data output driver comprising:

- a first transistor having a drain, a gate and a source, said drain of said first transistor being coupled to a power supply, said gate coupled to said control circuit, said source coupled to said circuit output; and
- a second transistor having a drain, a gate and a source, said drain being coupled to said circuit output, said gate coupled to said control circuit, said source coupled to ground wherein after said driver-and-clamp circuit clamps said circuit output to said intermediate voltage level, one of said first transistor and said second transistor is used to send a data to said circuit output.

* * * * *